United States Patent
Mukasa et al.

(10) Patent No.: US 6,504,665 B1
(45) Date of Patent: Jan. 7, 2003

(54) METHOD AND APPARATUS FOR MAGNETIC RECORDING

(75) Inventors: Koichi Mukasa, Sapporo (JP); Soshin Chikazumi, Niiza (JP); Eichi Hirota, Hirakata (JP); Ryosho Nakane, Sapporo (JP); Makoto Sawamura, Sapporo (JP)

(73) Assignee: Japan Science and Technology Corporation (JP)

(*) Notice: Subject to any disclaimer, the term of this patent is extended or adjusted under 35 U.S.C. 154(b) by 0 days.

(21) Appl. No.: 09/424,370

(22) PCT Filed: Feb. 9, 1999

(86) PCT No.: PCT/JP99/00546
§ 371 (c)(1),
(2), (4) Date: Nov. 23, 1999

(87) PCT Pub. No.: WO99/50833
PCT Pub. Date: Oct. 7, 1999

(30) Foreign Application Priority Data

Mar. 30, 1998 (JP) ............................................. 10-083994

(51) Int. Cl.$^7$ ................................................ G11B 5/02
(52) U.S. Cl. ................................................ 360/55
(58) Field of Search .............................. 360/59, 55, 131, 360/101, 220

(56) References Cited

U.S. PATENT DOCUMENTS

| | | | | |
|---|---|---|---|---|
| 4,412,264 A | * | 10/1983 | Imamura et al. | ............ 360/131 |
| 4,796,241 A | * | 1/1989 | Hayakawa et al. | ............ 369/13 |
| 5,079,219 A | * | 1/1992 | Barnes | ............ 360/131 |
| 5,331,491 A | * | 7/1994 | Hayakawa et al. | ............ 360/110 |
| 6,356,406 B1 | * | 3/2002 | Takano et al. | ............ 360/101 |

OTHER PUBLICATIONS

B.G. Demczyk, "Domains and Domain Nucleation in Magnetron–Sputtered CoCr Thin Films", IEEE Trans. Mag., vol. 28, No. 2, p998–1002, 1992.*

Jian–Gang Zhu et al, "Magnetization Structure in Thin–Film Recording Media", IEEE Transactions on magnetics, vol. 27, No. 4, Jul. 1991, pp 3553–3562.*

Tonomura et al, Phys. Rev. Lett., vol. 44, No. 21, pp. 1430–1433, 1980.

Fredkin, IEEE Trans., MAG., vol. 26, No. 5, p. 1518–1520, 1990.

Runge et al, J. Appl. Phys., vol. 79, No. 8, pp. 5075–5077, 1996.

Ishii et al, J. Appl. Phys., vol. 81, No. 4, pp 1847–1850, 1997.

* cited by examiner

Primary Examiner—Regina N. Holder
Assistant Examiner—Varsha A. Kapadia
(74) Attorney, Agent, or Firm—Lorusso & Loud

(57) ABSTRACT

To provide a magnetic recording method and apparatus which utilize a spin vortex as a recording unit and which enables high density recording, spin vortices (2) are recorded on a recording medium (1) such that the spin vortices (2) are aligned to form a recording track (3). The recording medium (1) is formed of a magnetic super-thin film, and positive and negative recorded spin vortices (2) are aligned thereon.

17 Claims, 3 Drawing Sheets

F I G. 4(a)
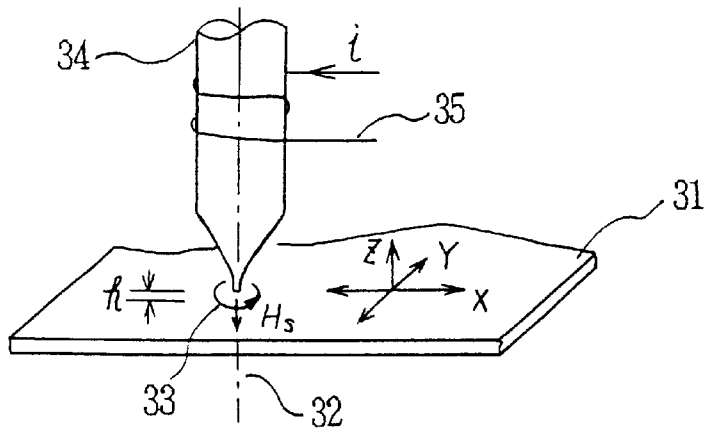
F I G. 4(b)
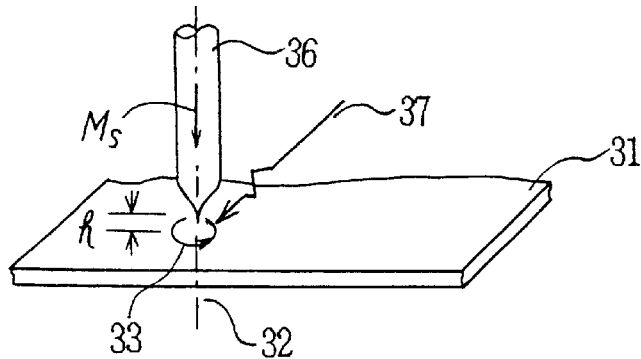
F I G. 4(c)
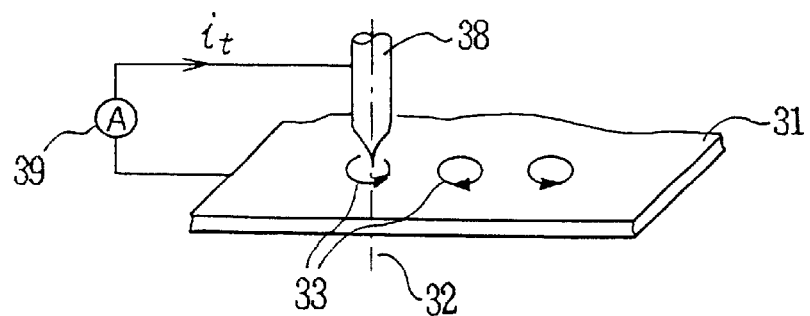

METHOD AND APPARATUS FOR MAGNETIC RECORDING

TECHNICAL FIELD

The present invention relates to a high-density magnetic recording method and to a magnetic recording apparatus for carrying out the method.

BACKGROUND ART

Conventionally, there has been known an apparatus which records a signal on a magnetic recording medium through a magnetic head and reproduces the signal from the magnetic recording medium through the magnetic head. An example of such an apparatus is a magnetic disk apparatus. Also, a magneto-optical recording apparatus has been known. In the magneto-optical recording apparatus, a signal is recorded on a recording medium by a magnetic head while a laser beam is radiated onto the recording medium, and a recorded signal is reproduced by Kerr rotation of the laser beam. An example of such a magneto-optical recording apparatus is an optical disk drive in which a laser is radiated onto a recording medium to change the state thereof in order to record a signal, and the change in the state is detected in order to reproduce the signal. Recording methods and apparatuses of these types have realized a recording density of 1 $GB/cm^2$ and are expected to realize a recording density of 10 $GB/cm^2$ in the future.

However, when a huge amount of data must be processed, the above-described recording density of 1 to 10 $GB/cm^2$ is insufficient. Therefore, the conventional methods and apparatuses are not satisfactory.

Incidentally, existence of spin vortices has been observed for Co fine particle [A. Tonomura et al., Phys. Rev. Lett., Vol. 44 No. 21 (1980), p. 1430].

Further, a study on a magnetization process of thin film of permalloy fine particles revealed a phenomenon in which spin vortices are generated in the course of formation of magnetic domains [D. R. Fredkin et al., IEEE Trans. MAG, Vol. 26 No. 5 (1990), p. 1518; K. Ruage et al., J. Appl. Phys., Vol. 79 No. 8 (1996), p. 5075].

Moreover, in a computer simulation of magnetization process of a circular sample such as of Ba-ferrite having a large uniaxial magnetic anisotropy, calculation has been performed on the premise of a spin vortex structure [Y. Ishii et al., J. Appl. Phys., Vol. 81 No. 4 (1997) p. 1847).

Although mere observation and studies on magnetic structures have been performed, an idea of utilizing spin vortices for magnetic recording has not been proposed.

In order to utilize spin vortices for magnetic recording, the present inventors theoretically elucidated a mechanism and conditions for formation of spin vortices within a magnetic thin film, and discovered the relationship between the formation of spin vortices and the magnetism of the thin film. Further, on the basis of this finding, the present inventors discovered conditions for writing, reading, or overwriting a signal for the case where each spin vortex is used as a recording unit, and found that despite a recording unit having a very small size of about 10 nm, spin vortices are magnetically and thermally stable and therefore can be practically used for magnetic recording.

The present invention proposes a novel magnetic recording method and apparatus in which each spin vortex is used as a recording unit, as well as properties of a magnetic head and properties of a magnetic thin film serving as a magnetic recording medium, which properties are peculiar to spin vortex recording.

In view of the foregoing, an object of the present invention is to provide a magnetic recording method and apparatus which utilize a spin vortex as a recording unit and which enable high density recording.

DISCLOSURE OF THE INVENTION

To achieve the object, the present invention provides the following methods and apparatuses.

(1) A magnetic recording method in which a signal magnetic field is applied to a fine region of a magnetic thin film in order to form a spin vortex composed of a magnetization region surrounding circularly the perpendicular magnetization axis at the center, to thereby record a signal, and a direction and magnitude of magnetization of the spin vortex is detected in order to reproduce the recorded signal.

(2) A magnetic recording method described in (1) above, wherein the direction of magnetization of a spin vortex corresponding to a recorded signal is reversed in order to overwrite the recorded signal.

(3) A magnetic recording method described in (2) above, wherein recording or overwriting of a signal is performed while the magnetic thin film is heated.

(4) A magnetic recording method described in (2) above, wherein any one of recording, overwriting and reproduction of a signal or a combination thereof is performed by use of a columnar magnetic needle.

(5) A magnetic recording method described in (1) above, wherein a recorded signal is erased through thermal demagnetization of the magnetic thin film.

(6) A magnetic recording apparatus comprising:
a magnetic thin film on which, upon application of a signal magnetic field to a fine region thereof, a spin vortex composed of a magnetized region surrounding circularly the perpendicular magnetization axis at the center is formed;
signal recording means for recording a signal onto the magnetic thin film; and
signal reproduction means for detecting a direction and magnitude of magnetization of the spin vortex in order to reproduce the recorded signal.

(7) A magnetic recording apparatus described in (6) above, wherein the magnetic thin film is formed of a super-thin film having a thickness substantially equal to or less than the thickness of a domain wall.

(8) A magnetic recording apparatus described in (6) above, wherein the magnetic thin film is formed of a magnetic thin film having low in-plane magnetic anisotropy.

(9) A magnetic recording apparatus described in (6) above, wherein the magnetic thin film has an easy axis perpendicular to the surface of the magnetic thin film.

(10) A magnetic recording apparatus described in (6) above, wherein the magnetic thin film is formed of an array of circular thin films.

(11) A magnetic recording apparatus described in (6) above, wherein the magnetic thin film is formed on a grid of soft magnetic thin wires.

(12) A magnetic recording apparatus described in (6) above, wherein the magnetic thin film is a thin film formed on an array of disks each made of a material having a high magnetic flux density and having a diameter smaller than that of a spin vortex.

(13) A magnetic recording apparatus described in (6) above, wherein the magnetic thin film is a thin film formed on an array of disks each made of a magnet or an antiferromagnetic material and having a diameter smaller than that of a spin vortex, so that the magnetic thin film has local perpendicular magnetic anisotropy at a position corresponding to each disk.

(14) A magnetic recording apparatus described in (6) further comprising means for overwriting a recorded signal by reversing direction of magnetization of a spin vortex corresponding to the recorded signal.

(15) A magnetic recording apparatus described in (6) further comprising means for heating the magnetic thin film when a signal is recorded or overwritten on the magnetic thin film.

(16) A magnetic recording apparatus described in (6) further comprising means for erasing a recorded signal through thermal demagnetization of the magnetic thin film.

(17) A magnetic recording apparatus described in (6) further comprising a columnar magnetic needle which is used for any one of recording, overwriting, and reproducing of a signal or a combination thereof.

The magnetic recording method and apparatus according to the present invention enable recording at a high density of 1 TB/cm$^2$, so that a compact storage device having a large capacity of a terabit order can be provided.

Although the magnetic recording method and apparatus according to the present invention are based on magnetic recording, use of spin vortices for magnetic recording enables construction of theoretically new recording units to thereby enable realization of a recording density 1000 times that achieved by conventional methods.

BRIEF DESCRIPTION OF THE DRAWINGS

FIGS. 4(*a*)–4(*c*) are schematic views showing an exemplary operation of magnetic recording using spin vortices according to the present invention.

BEST MODE FOR CARRYING OUT THE INVENTION

Figure 1A:
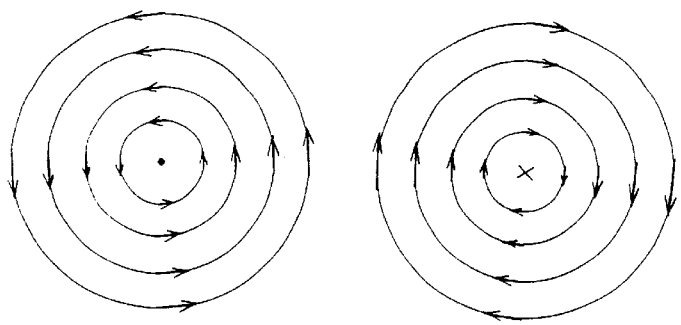
FIGS. 1(*a*) and 1(*b*) are diagrams showing the magnetic structures of positive and negative spin vortices recorded on a recording medium (magnetic super-thin film) according to the present invention.

Embodiments of the present invention will be described in detail.

In the present invention, a magnetic structure formed in a fine region of a magnetic thin film is used as a recording unit. The fine magnetic structure includes the perpendicular magnetization that is formed at the center thereof to be perpendicular to the surface of the thin film, as well as circular lines of magnetic force surrounding the line of magnetic force at the center. Although the size of the magnetic structure depends on the material of the magnetic thin film, the magnetic structure has a radius of about 10 nm.

The fine magnetic structure used as a recording unit in the present invention will be referred to as a "spin vortex"because of its shape.

The concept of the present invention will now be described.

It is assumed that the magnitude of saturation magnetization of the magnetic thin film is $M_s$; and that the magnetic thin film is magnetically isotropic within the film plane, has a uniaxial anisotropy perpendicular to the film plane, and the anisotropic constant is K. When the vertical direction corresponds to an easy axis, K assumes a negative value.

When the thickness of the magnetic thin film is close to a critical thickness $t_s = (A/2\pi M_s^2)^{1/2}$, where A is a stiffness constant of exchange interaction of the magnetic thin film, spins are aligned in the thickness direction of the film due to a strong exchange interaction. Also, the direction of a spin does not change greatly in the thickness direction, even when the film thickness is equal to or smaller than that of a domain wall $t_w = (A/|K|)^{1/2}$.

The spin vortex according to the present invention is characterized in that its magnetic structure substantially does not change in the thickness direction of the magnetic thin film and the thickness of the magnetic thin film is not greater than $t_w$. Such very thin film will be referred to as a "super-thin film." In a magnetic super-thin film, a spin vortex has a radius $D \approx 2.5[A/(K+2\pi M_s^2)]^{1/2}$. Since K is negative, the radius D decreases as the degree of uniaxial anisotropy decreases, as the saturation magnetization $M_s$ increases, and as the value of A; i.e., the Curie temperature of the magnetic material decreases (when the magnetic thin film has an easy plane where K is positive, the radius D decreases as the anisotropy constant increases). Table 1 shows the D value of super-thin films of typical magnetic materials; i.e., Fe, Co, and Ni. In the case of Fe, the (100) face becomes the film surface. In the case of Co, the (001) face becomes the film surface. In the case of Ni, the (111) face becomes the film surface.

TABLE 1

| Magnetic film | Fe (100) face | Co (001) face | Ni (111) face |
| --- | --- | --- | --- |
| Radius: D (nm) | 8.0 | 10 | 17 |
| Magnetization: 0.32 $M_s$ (G) | 550 | 455 | 155 |
| Reversal magnetic field: $H_s$ (T) | 2.10 | 1.14 | 0.37 |
| Domain wall thickness: $t_w$ (nm) | 20.6 | 5.3 | 12.6 |

In the case of Fe, which is a commonly-employed magnetic material, the radius D becomes 8 nm. A spin vortex assumes a stable state in which the perpendicular magnetization at the center is directed in a negative direction along a line normal to a thin film, or a stable state in which the perpendicular magnetization at the center is directed in a positive direction along the normal line. When a magnetic field not weaker than the reversal magnetic field $H_s$ is applied in the opposite direction, the direction of the perpendicular magnetization at the center is reversed, so that the spin vortex alternates between the two states.

The reversal magnetic field $H_s$ is represented by $H_s \approx (2K/M_s) + 4\pi M_s$, and is 2.10 T for the case of Fe. Table 1 shows the values of $H_s$ for thin films formed from the above-mentioned magnetic materials.

Since the radius D of the spin vortex is represented by $D \approx 2.5[2A/(M_s H_s)]^{1/2}$ the reversal magnetic field increases as the radius of the spin vortex decreases. Further, when a magnetic field not weaker than $H_s$ is applied to a demagnetized super-thin film, a spin vortex is formed such that it is oriented in the direction of the applied magnetic field. However, in either case, the spread of $H_s$ is set to about 2D. Each spin vortex has a magnetization of about 0.32 $M_s$. In this case, the magnitude of saturation magnetization $m_s$ per spin vortex is represented by $m_s = (0.32 M_s)(\pi D^2 t)$, where t is the thickness of a super-thin film, and is $2.3 \times 10^{-15}$ emu in the case of Fe. When this direction and magnitude of magnetization is detected by use of a magnetic sensor, the presence/absence of a spin vortex and its orientation can be detected. When the magnetic field $H_s$ is turned on or off in accordance with a signal to be recorded, a positive or negative spin vortex is formed on a magnetic super-thin film, so that electrical signals can be recorded by means of spin vortices each serving as a magnetic recording unit.

The recording through use of spin vortices is binary recording, and overwriting can be performed for each recording unit. Therefore, overwrite (operation of writing information at a certain storage location while information previously stored thereat is destroyed) can be performed for each recording unit. A recorded signal can be detected through detection of the direction and magnitude of magnetization of a recorded spin vortex.

As described above, the present inventors discovered conditions for utilizing spin vortices of a magnetic super-thin film, each serving as a magnetic recording unit having a size of about 10 nm. Table 1 shows characteristics of a single spin vortex serving as a magnetic recording unit for each of super-thin films formed from typical magnetic materials.

Since spin vortices essentially have a stable magnetic structure, the magnetic recording by use of spin vortices in accordance with the present invention is considerably stable when used for high density recording, as compared with conventional magnetic recording techniques, despite employment of the very small recording unit of about 10 nm. This is one of the important features of the present invention, because in the case of conventional magnetic recording techniques, when the recording unit is reduced in size to about 100 nm, magnetization of each recording unit decreases or disappears due to leakage magnetic fields or thermal agitation, resulting in decreased stability.

Although the stability of spin vortices requires a strong magnetic field at the time of recording or overwriting, the required strength of a magnetic field can be decreased when a magnetic thin film to be subjected to recording or overwriting is locally heated. That is, since the strength of magnetic fields of the thin film decreases as a result of heating, with a resultant decrease in the reversal magnetic field, recording and overwriting by use of a weak magnetic field become possible.

A recorded signal can be erased through thermal demagnetization. A laser beam may be used for local heating.

A magnetic material suitable for thin film used in the present invention is a soft magnetic material, whereas conventional magnetic recording media are formed from a hard magnetic material. Preferably magnetic anisotropy does not exist within the plane of the thin film. An example of a material having no magnetic anisotropy is a Ni—Fe alloy. A material which has no crystal magnetic anisotropy and whose magnetostrictive constant is zero is known as a permalloy.

Amorphous magnetic materials whose magnetostrictive constants are zero, FeAlSi alloys, and MnZn ferrite (oxide material) can be used as well. Use of these material enables formation of a magnetic thin film having no in-plane magnetic anisotropy. Since K=0 in such a thin film, theoretically $H_s$ becomes approximately $4\pi M_s$.

Since the magnetic thin film according to the present invention is used in the form of a super-thin film having a thickness of 20 nm or less, the thin film may be formed of an ordinary soft magnetic material. When a super-thin film of Fe, Ni or Co is formed on an appropriate substrate layer to a thickness of 10 nm to thereby form a thin film shown in Table 1, the formed thin film exhibits magnetic anisotropy in a direction perpendicular to the film but is isotropic within the film plane. Since K<0, the value of $H_s$ is smaller than $4\pi M_s$ (Table 1). A support for a magnetic thin film is formed from an amorphous material such as glass, plastic, or a crystalline material such as Al or Si, depending on the intended purpose.

The magnetic thin film according to the present invention is desirably formed such that spin vortices are easily formed at predetermined positions on the film when the magnetic thin film is used as a magnetic recording medium on which recording is performed by means of spin vortices.

In one method, a magnetic recording medium is formed of an array of thin film disks each having a diameter equal to or smaller than that of a spin vortex, and a spin vortex is formed in a thin film disk in accordance with a signal to thereby record the signal. The spin vortex formed in each disk has an inherent direction and magnitude of magnetization which depends on the diameter of the disk. Therefore, when the diameter of the disks is changed as needed, the magnetization of positive and negative spin vortices is changed, so that magnetic recording of multi-value signals becomes possible. Thus, the magnetic thin film according to the present invention serves as an advanced recording medium for information processing.

In another method, a disk formed from a magnetic material having a high magnetic flux density, a magnet, or an antiferromagnetic material and having a diameter equal to or smaller than that of a spin vortex is added to a thin film at a predetermined location where the spin vortex is formed. Since the value of $M_s$ and the value of K of the thin film increase locally at the position where the disk is attached to the thin film, the value of $H_s$ of the thin film decreases, so that a stable spin vortex is formed at that position.

In still another method, two sets of straight strips formed of a soft magnetic material and having a width narrower than the diameter of a spin vortex are disposed such that the two sets of strips perpendicularly intersect each other in order to form a grid; and a magnetic thin film is formed thereon. In this case, the value of $H_s$ is small in each straight portion and becomes further smaller at an intersection between two strips because of an increased thickness of the soft magnetic strips.

Accordingly, a most stable spin vortex can be formed at an intersection between two strips. Since positions where stable spin vortices are formed or passages along which spin vortices move can be formed on a magnetic thin film, there can be fabricated not only an apparatus for performing magnetic recording or storage but also an apparatus having a versatile signal processing function. The spin vortex according to the present invention moves upon application of a magnetic field having a gradient. Therefore, a logical operation element utilizing spin vortices can be constructed.

A columnar magnetic needle is preferably used in a so-called writing head used for writing and overwriting of a spin vortex, because the columnar magnetic needle generates magnetic fields symmetrically with respect to the tip end of the columnar magnetic needle. The desired maximum strength of a magnetic field is $H_s$. A needle is formed from a soft magnetic material having a high magnetic flux density such that the tip end has a diameter substantially equal to that of a spin vortex. Subsequently, an electromagnet is constructed while the needle is used as a core to thereby fabricate a magnetic head that generates a desired magnetic field in accordance with an electrical signal. The magnetic head enables writing and overwriting of signals by means of spin vortices.

In the case of thermal magnetic recording in which a recording medium is locally heated through radiation of a laser beam or the like, writing and overwriting can be performed even when the magnetic field generated by the head is weaker than $H_s$. Further, a magnetic needle formed from a magnetic material may be used as a write head. In this case, the distance between a magnetic thin film and the write head is changed in accordance with a signal. Especially, when exchange force between magnetic members is utilized, writing and overwriting can be performed by use of a magnetic field having a high effective strength.

In the present invention, a high sensitivity magnetic sensor is used for detection of the direction and magnitude of magnetization of a recorded spin vortex, and a technique utilized by a probe scanning microscope or a technique utilized by a microscope designed to detect tunnel current, magnetic force, or exchange force may be utilized. Detection based on a magneto-resistance effect or a magneto-optical effect may be utilized for signal read-out. Especially, a scanning spin microscope capable of detecting individual spins is advantageously used for detection of fine magnetization.

Next, embodiments of the present invention will be described.

Figure 1B:
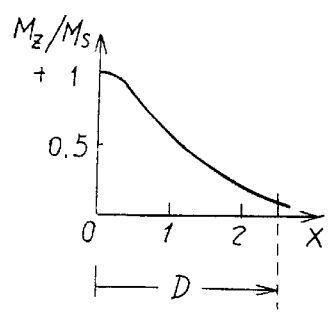

FIGS. 1(a) and 1(b) are diagrams showing the magnetic structures of positive and negative spin vortices recorded on a recording medium (magnetic super-thin film) according to the present invention, wherein FIG. 1(a) shows the distributions of magnetization magnitude of the positive and negative spin vortices within the plane of a medium, and FIG. 1(b) shows the distributions of magnetization magnitude of the spin vortex in the direction perpendicular to the plane of the medium (for the case of positive spin).

When the inclination angle of the magnetization magnitude with respect to a line normal to a medium surface is represented by θ and the distance from the center of the spin vortex is represented by ρ, the distribution of magnetization magnitude of the spin vortex recorded on a recording medium is determined by the following expression:

$$d^2\theta/dx^2 + d\theta/xdx + [1-(1/x^2)]\sin\theta\cos\theta = 0$$

where $x = \rho/[(2A/M_sH_s)^{1/2}]$.

The radius D of the spin vortex is defined as a distance between the center and a radial position where $M_z$ becomes $0.1 M_S$.

Figure 2A:
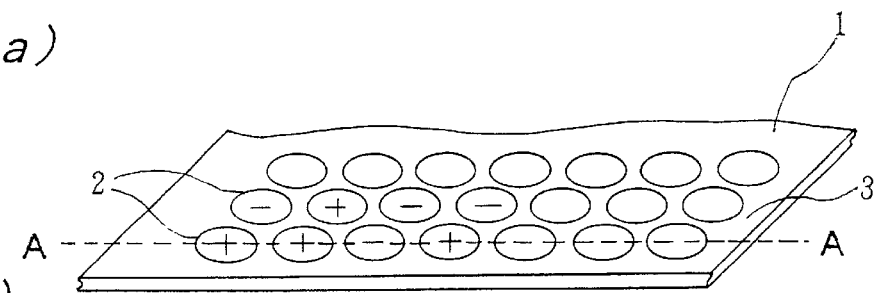
FIGS. 2(*a*) and 2(*b*) are views showing the concept of magnetic recording according to the present invention wherein a spin vortex is used as a recording unit.
Figure 2B:
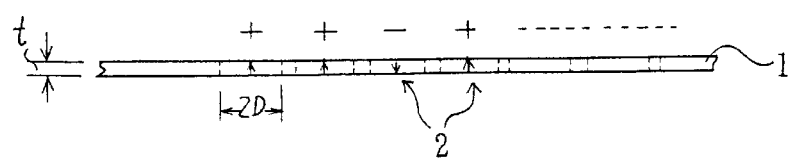

FIGS. 2(a) and 2(b) are views showing the concept of magnetic recording according to the present invention wherein a spin vortex is used as a recording unit, wherein FIG. 2(a) shows an array of spin vortices recorded on a recording medium, and FIG. 2(b) shows a magnetized state in a sectional view taken along a recording track indicated by broken line A—A in FIG. 2(a).

In FIGS. 2(a) and 2(b), reference numeral 1 denotes a magnetic super-thin film serving as a recording medium, reference numeral 2 denotes positive and negative recorded spin vortices, and reference numeral 3 denotes a recording track. The direction of the perpendicular magnetization at the center of each recorded spin vortex is represented by an arrow. Reference numeral 2D represents the diameter of a spin vortex, and reference symbol t represents the thickness of the recording medium.

As described above, the spin vortices are recorded on the recording medium 1 in an arrayed manner to thereby form the recording track 3. The recording medium 1 is formed of a magnetic super-thin film, and positive and negative recorded spin vortices 2 are arrayed thereon.

FIGS. 3(a)–3(d) are schematic views each showing an exemplary structure of a recording medium used for spin vortex recording according to the present invention, and in each drawing an arrow indicates a recording surface.

Figures 3A, 3B, 3C, 3D:
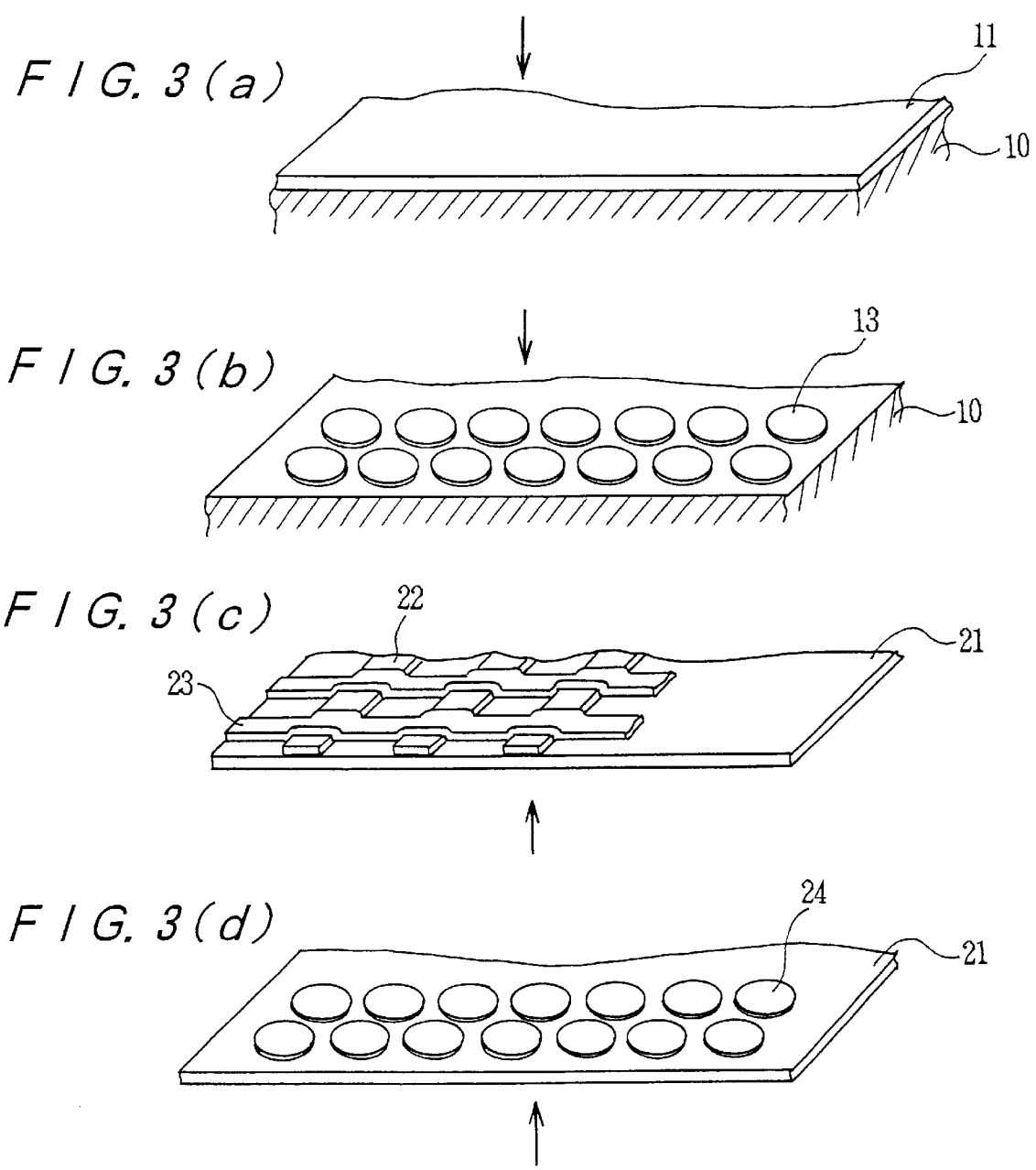
FIGS. 3(*a*)–3(*d*) are schematic views each showing an exemplary structure of a recording medium used for spin vortex recording according to the present invention.

FIG. 3(a) is a view showing a super-thin film recording medium formed on a support. The super-thin film recording medium is formed of a soft magnetic material having substantially no in-plane magnetic anisotropy. Reference numeral 10 denotes the support, and reference numeral 11 denotes the super-thin film recording medium formed of a soft magnetic material having substantially no in-plane magnetic anisotropy.

FIG. 3(b) is a view showing a recording medium formed from an array of disks of soft magnetic super-thin film disposed on a support. Reference numeral 10 denotes the support, and reference numeral 13 denotes the disks of soft magnetic super-thin film.

FIG. 3(c) is a view showing a recording medium (the support is omitted) formed on a grid that is formed by two sets of thin lines of soft magnetic super-thin film. Reference numeral 21 denotes the recording medium, and reference numerals 22 and 23 denote the soft magnetic thin lines forming the grid.

FIG. 3(d) is a view showing a soft-magnetic super-thin film recording medium to which are added an array of magnetic disks each having a diameter smaller than that of spin vortices to be recorded. The magnetic disks 24 of the recording medium 21 are each formed of a soft magnetic material having a high magnetic flux density, a magnet magnetized in a direction perpendicular to the disk surface, or an antiferromagnetic material having an easy axis perpendicular to the disk surface (the support is omitted).

FIGS. 4(a)–4(c) are schematic views showing an exemplary operation of magnetic recording using spin vortices according to the present invention.

As shown in FIG. 4(a), an electromagnet-type head (having a soft-magnetic columnar core of a high magnetic flux density) 34 is used for writing or overwriting a signal. That is, through application of signal current to the electromagnet-type head 34, a leakage magnetic field at the tip of the electromagnet type head 34 is changed in order to form a spin vortex 33 on a recording medium 31 or to reverse the direction of magnetization of the spin vortex. Thus, the signal is written or overwritten. The distance h between the recording medium 31 and the electromagnet-type head 34 is maintained constant. The position of the electromagnet-type head 34 can be changed relative to the recording medium 31 with a required accuracy, so that the electromagnet-type head 34 scans. Reference numeral 32 denotes the center line of the electromagnet-type head 34, and reference numeral 35 denotes a coil through which a signal current i flows.

FIG. 4(b) shows an example of thermal magnetic recording. The distance h between a columnar magnet needle 36 and a recording medium 31 is changed in accordance with a signal. When the recording medium 31 is heated locally by radiation of a heating laser pulse 37 simultaneously with a reduction in the distance h (approach), a spin vortex 33 is formed. Also, when the laser is radiated in a state in which the distance h has been increased, the spin vortex 33 is erased through thermal demagnetization. The columnar magnet needle 36 can scan over the recording medium.

FIG. 4(c) is an example of detection of a spin vortex (reproduction of a recorded signal).

Detection is performed in accordance with a tunnel current method. That is, a conductive columnar needle is used as a detection head 38. While the detection head 38 is caused to travel over a recording medium 31, the electric resistance between the detection head 38 and the recording medium 31 is measured by use of a current measurement device 39. Thus, the direction and magnitude of magnetization of a spin vortex 33 are detected as changes in tunnel current induced by the magneto-resistance effect, so that the recorded signal is reproduced. The distance h between the detection head 38 and the recording medium 31 is maintained constant.

EXAMPLE 1

A MgO monocrystal was used as a support, and an underlying layer of 1 nm thick was grown on a predetermined crystal face of the support in a super-high vacuum. Subsequently, Fe, Co, or Ni was vapor-deposited to a thickness of 10 nm. Thus, the magnetic thin films shown in Table 1 were fabricated. Each of these thin films is an aggregation of fine crystalline particles having a fibrous structure in which specific crystal axes are aligned perpendicular to the surface of the thin film. Since the thin film is polycrystalline, its in-plane magnetic anisotropy is small. A magnetic needle was fabricated from a Fe monocrystal such that the [100] axis of the Fe monocrystal became the center axis. Subsequently, the tip end was subjected to electropolishing, ion milling, and evaporation in a strong electric field in order to form a tip end surface along the (100) plane. An electromagnet was fabricated, while the magnetic needle was used as a core, and used as a writing head. The writing head was caused to approach the magnetic thin film from the normal direction, and the direction of magnetization of the tip end was changed according to a signal current to thereby write a signal onto the magnetic thin film.

Measurement under an electron microscope revealed that the size of a recorded spin vortex is about 15 nm for the case of Fe, about 20 nm for the case of Co, and about 35 nm for the case of Ni. Measurement under a scanning spin microscope revealed that the magnetization of a recorded spin vortex is 550 G for the case of Fe, 450 G for the case of Co, and 150 G for the case of Ni. The size and the magnetization show close agreement with the theoretical values shown in Table 1.

EXAMPLE 2

An alloy of 80% Ni and 20% Fe (atomic percentage) was vapor-deposited on a glass support to form disks of polycrystalline film having a thickness of 10 nm. The in-plane magnetic anisotropy is small. Disks having a diameter of 40 nm were formed in one sample, and disks having a diameter of 20 nm were formed in another sample. A magnetic needle was formed of Ni, and an electromagnet was fabricated while the magnetic needle was used as a core. This electromagnet was used as a writing head. The writing head was caused to approach, from the normal direction, the disks of each type serving as a recording medium, and a laser pulse was radiated simultaneously with application of a signal current. A spin vortex was formed in the recording medium disk in the same direction as the magnetization direction of the head, and a signal was recorded. The magnetization of a recorded spin vortex was 200 G for the disk having a diameter of 40 nm, and 50 G for the disk having a diameter of 20 nm. In the present example, recording operation was repeated while the magnitude of the signal current was changed. As a result, it was confirmed that a signal can be written even when the maximum magnetic field of the tip end portion of the head is smaller than the reversal magnetic field.

EXAMPLE 3

An alloy film of the same composition as that used in Example 2 was vapor-deposited to a thickness of 10 nm, an array of disks (diameter: 20 nm, thickness: 10 nm) formed from the same alloy was formed thereon, and the resultant film was used as a recording medium. A needle formed of a PtCo magnet was used as a magnetic head. The magnetic head was caused to approach the disks on the recording medium from the normal direction, and simultaneously, a laser pulse was radiated onto the recording medium. A spin vortex was formed in a disk which the head approached.

When a laser was not radiated, no spin vortex was formed. When the laser was turned on and off in accordance with a signal, the signal could be recorded in the form of a spin vortex. Further, when the head was not caused to approach the recording medium and only the laser was radiated onto the recording medium, the spin vortex disappeared and the signal was erased.

That is, recording and overwriting of information were performed through formation and erasure of spin vortices.

The present example confirmed the following. When the array of disks (diameter: 20 nm, thickness: 10 nm) is formed of Co film, the [001] axis (easy axis) of the Co film disk becomes perpendicular to the surface of the thin film, and vertical anisotropy is imparted locally to a location where the Co disk is attached, so that the reversal magnetic field of the thin film becomes weaker at that location, at which a spin vortex recorded in the same manner as in the above-described writing operation is located stably.

Further, the same effect was confirmed even when the disks were formed through sputter-deposition of NiO in place of Co.

EXAMPLE 4

A recording medium was fabricated in the same manner as in Example 3, except that in place of an array of disks, two sets of straight strips; i.e., vertical strips and horizontal strips, each having a width of 20 nm and a thickness of 10 nm, were disposed to form a grid. When a writing operation was performed on the recording medium in the same manner as in Example 3, a spin vortex was formed at an intersection of the grid where the head approached closest, so that a signal was written. The recorded signal was able to be erased.

The present invention is not limited to the above-described embodiments. Numerous modifications and variations of the present invention are possible in light of the spirit of the present invention, and they are not excluded from the scope of the present invention.

INDUSTRIAL APPLICABILITY

As described above, the present invention enables a spin vortex to be used as a recording unit. Therefore, the present invention is useful for recording methods and magnetic recording apparatuses that enable high density storage.

What is claimed is:

1. A magnetic recording method in which a signal magnetic field is applied to a fine region of a magnetic thin film in order to form a spin vortex having a radius of about 10 nm and composed of a magnetization region surrounding circularly a perpendicular magnetization axis at the center, to thereby record a signal by using the spin vortex as a recording unit, and a direction and magnitude of the spin vortex is detected in order to reproduce the recorded signal.

2. A magnetic recording method according to claim 1, wherein the direction of magnetization of a spin vortex corresponding to a recorded signal is reversed in order to overwrite the recorded signal.

3. A magnetic recording method according to claim 2, wherein recording or overwriting of a signal is performed while the magnetic thin film is heated.

4. A magnetic recording method according to claim 2, wherein any one of recording, overwriting, and reproducing of a signal or a combination thereof is performed by use of a columnar magnetic needle.

5. A magnetic recording method according to claim 1, wherein a recorded signal is erased through thermal demagnetization of the magnetic thin film.

6. A magnetic recording apparatus comprising:

(a) a magnetic thin film on which, upon application of a signal magnetic field to a fine region thereof, a spin vortex having a radius of about 10 nm and composed of a magnetization region surrounding circularly a perpendicular magnetization at the center is formed;

(b) signal recording means for recording a signal onto the magnetic thin film; and (c) signal reproduction means for detecting a direction and magnitude of magnetization of the spin vortex in order to reproduce the recorded signal.

7. A magnetic recording apparatus according to claim 6, wherein the magnetic thin film is formed of a super-thin film having a thickness substantially equal to or less than a thickness of a domain wall.

8. A magnetic recording apparatus according to claim 6, wherein the magnetic thin film is formed of a magnetic thin film having low in-plane magnetic anisotropy.

9. A magnetic recording apparatus according to claim 6, wherein the magnetic thin film has an easy axis perpendicular to the surface of the magnetic thin film.

10. A magnetic recording apparatus according to claim 6, wherein the magnetic thin film is formed of an array of circular thin films.

11. A magnetic recording apparatus according to claim 6, wherein the magnetic thin film is formed of a grid of soft magnetic thin lines.

12. A magnetic recording apparatus according to claim 6, wherein the magnetic thin film is a thin film formed of an array of disks each made of a material having a high magnetic flux density and having a diameter smaller than that of a spin vortex.

13. A magnetic recording apparatus according to claim 6, wherein the magnetic thin film is a thin film formed of an array of disks each made of a magnet or an antiferromagnetic material and having a diameter smaller than that of a spin vortex, so that the magnetic thin film has local vertical magnetic anisotropy at a position corresponding to each disk.

14. A magnetic recording apparatus according to claim 6 further comprising means for overwriting a recorded signal by reversing direction of magnetization of a spin vortex corresponding to the recorded signal.

15. A magnetic recording apparatus according to claim 6 further comprising means for heating the magnetic thin film when a signal is recorded or overwritten on the magnetic thin film.

16. A magnetic recording apparatus according to claim 6 further comprising means for erasing a recorded signal through thermal demagnetization of the magnetic thin film.

17. A magnetic recording apparatus according claim 6 further comprising a columnar magnetic needle which is used for any one of recording, overwriting, and reproducing of a signal or a combination thereof.

* * * * *